United States Patent [19]
Menzel

[11] 4,372,989
[45] Feb. 8, 1983

[54] PROCESS FOR PRODUCING COARSE-GRAIN CRYSTALLINE/MONO-CRYSTALLINE METAL AND ALLOY FILMS

[75] Inventor: Guenther Menzel, Munich, Fed. Rep. of Germany

[73] Assignee: Siemens Aktiengesellschaft, Berlin & Munich, Fed. Rep. of Germany

[21] Appl. No.: 157,826

[22] Filed: Jun. 9, 1980

[30] Foreign Application Priority Data

Jun. 20, 1979 [DE] Fed. Rep. of Germany ....... 2924920

[51] Int. Cl.³ ............................................. B05D 3/06
[52] U.S. Cl. ............................... 427/53.1; 219/121 L; 219/121 LW
[58] Field of Search .................. 427/53.1; 219/121 L, 219/121 LW

[56] References Cited

U.S. PATENT DOCUMENTS 3,585,088 6/1971 Schwuttke et al. ................ 427/53.1
3,873,341 3/1975 Janus .................................. 427/53.1
4,059,461 11/1977 Fan et al. ............................ 427/53.1

FOREIGN PATENT DOCUMENTS 2727659 1/1979 Fed. Rep. of Germany .

OTHER PUBLICATIONS

Gangulee et al., "Thin Solid Films", V 16, pp. 227-236 (1973).

*Primary Examiner*—John H. Newsome
*Attorney, Agent, or Firm*—Hill, Van Santen, Steadman, Chiara & Simpson

[57] ABSTRACT

Coarse-grained crystalline or monocrystalline metal or alloy regions are produced on substrates composed of a material selected from the group consisting of a ceramic, a glass and silicon, and which are provided with a layer of an amorphous or disordered metallic film, for example tantalum, by controllably irradiating select regions of the amorphous film with a focused beam of thermal-energy and/or light-energy, such as obtained from a focused laser beam, while substantially simultaneously maintaining the temperature of such substrate at about the temperature utilized in depositing the amorphous film on the substrate, whereby crystallization seeds are generated at the point of beam irradiation and function as a starting point for the crystalline or monocrystalline front on the metallic surface. Via controlled beam guidance, as by a computer, over the amorphous metal coated substrate surface, the crystallization front is extended uniformly in a desired path along the irradiated surface. The process is useful in producing metallizations for integrated semiconductor circuits, manufacture of contact electrodes for silicon solar cells, etc.

8 Claims, 2 Drawing Figures

PROCESS FOR PRODUCING COARSE-GRAIN CRYSTALLINE/MONO-CRYSTALLINE METAL AND ALLOY FILMS

BACKGROUND OF THE INVENTION

1. Field of the Invention

The invention relates to a process of producing coarse-grain crystalline and/or monocrystalline metal and alloy films and somewhat more particularly to a process of producing coarse-grain crystalline or monocrystalline metal or alloy films on substrates composed of ceramic, glass or silicon by conversion of an amorphous metallic film on such substrate into a coarse-grain crystalline or monocrystalline state.

2. Prior Art

Metal or alloy films on substrates composed of ceramic, glass or silicon are frequently used in electrical technology. Such thin metal films function, for example, as conductor path structures, electrical resistors or capacitors in semiconductor technology. Such metal films, which are employed in thin film technology, are frequently subjected to relatively high thermal stresses, with continuous loads of approximately 150° C. and intermittent loads of approximately 400° C. Despite such stresses, the stability of the film characteristics over prolonged periods of time, especially the electrical characteristics thereof, must be guaranteed.

Metal films are typically produced on substrates composed of glass, ceramic or silicon, via, for example, "atomization" (sputtering) or vapor-deposition and typically assume a finely crystalline form. At elevated temperatures, an uncontrolled growth of the crystallites can start, which in many instances can lead to significant changes in the film characteristics.

The prior art is aware that stabilization of metal films can be obtained by annealing such films at higher temperatures (ie., wherein T is greater than 400° C.). However, such high-temperature annealing can be very unfavorable in semiconductor-IC structures since the electrical components which are already present on a substrate can be substantially changed by the annealing temperature, because, for example, in the case of metal conductor paths, during the occurence of uncontrolled crystal growth, grain boundaries can arise crosswise or perpendicular to a conductor path. Such grain boundaries substantially raise the failure rate of a conductor path since mass transport of material by means of electron migration occurs via such boundaries, for example see *Thin Solid Films*, Vol. 16, pages 227–236 (1973).

German Offenlegungsschrift (hereinafter DE-OS) No. 27 27 659 suggests that monocrystalline thin metal films can be produced from amorphous metal films on substrates composed of ceramic, glass or silicon by thermally converting the amorphous film or layer into a monocrystalline state.

In accordance with this method, stable film characteristics are attained by depositing metal layers or films, preferably composed of tantalum, onto low temperature substrates, for example having −160° C. on the deposition surface, so that the deposited film is in an amorphous or greatly disordered form and thereafter crystallizing such amorphous film by very slightly heating the substrate. In this manner, coherent lattice spaces are enlarged from less than about 4 nm during deposition on the substrate up to crystals having a grain diameter of at least 70 μm upon heating the substrate up to about −90° C. Such films maintain their relevant characteristics at even much, much higher temperatures (ie., higher than +400° C.) even though during their fabrication process, they are exposed to no temperature higher than about −90° C.

SUMMARY OF THE INVENTION

The invention provides a method of stabilizing metal layers or regions deposited on substrates before their ultimate use, for example in integrated semiconductor circuits, in such a manner that the stabilized layers or regions exhibit no changes of relevant characteristics at relatively high temperatures or over prolonged periods of usage.

In accordance with the principles of the invention, amorphous or disordered metallic films are converted into coarse-grain crystalline or monocrystalline state not by thermal transmission over an entire substrate surface, such as is described in the above-referenced DE-OS No. 27 27 659, but rather in a different, more elegant manner which permits limiting the crystallization process in a directed manner to selected regions of the substrate with relatively low energy input, which thus protects the electrical components contained on the substrate from too large of thermal stresses.

In following the principles of the invention, a focused energy ray is controllably guided so as to irradiate onto select areas or regions of an amorphous or disordered metallic film on a substrate composed of a material selected from a group consisting of a ceramic, a glass or silicon while substantially simultaneously such coated substrate is maintained at about the temperature utilized in depositing the amorphous metallic film onto the substrate whereby crystallization seeds are spontaneously generated at the irradiation point and function as a starting point for a monocrystalline crystallization front on the metallic surface and which can be extended uniformly and controllably in any desired direction.

In preferred embodiments of the invention, a monochromatic light source, most preferably a focused laser beam, is utilized to provide the requisite energy beam. Further, the light beam or ray produced from such a light source can be controllably guided via a computer means operationally connected, for example, to a laser means.

In the practice of the invention, the crystallization seeds which are produced upon the irradiated substrate surface (which is maintained at about the temperature utilized to deposit an amorphous or disordered film on such substrate and which can range from about room temperature to about −160° C.) can be regulated so that the number of crystallization seeds generated in total can be drastically reduced relative to the number of crystallization seeds generated via the known gross thermal-treatment method. This results in a reduced grain or crystal count and thus in an increased size of crystallites and more stable film characteristics. Further, since during the conversion of metallic regions from amorphous to crystalline state, the coated substrate is maintained at relatively low temperatures, no additional crystallization seeds are generated through any inhomogenities in or on the substrate surface, which could be caused by impurities or energy peaks.

In certain embodiments of the invention, selectively structured amorphous metallic films or layers (ie., which can comprise select shapes or lines) can be provided on appropriate substrates (having, for example, a plurality of separate semiconductor circuit components thereon) at regions thereof requiring metallization and controllably irradiating such structured amorphous layers with a focused energy beam to convert the amorphous layer into a coarse-grained crystalline or monocrystalline state. Further, in certain embodiments of the invention, during such irradiation by a focused energy beam onto the structured or shaped amorphous metallic film, the irradiated beam can be scanned as desired to produce definitely shaped crystallization lines or areas. In this manner, a controllable guidance of the energy beam, which can also be controlled via a computer means, is attained and such controlled guidance insures that the generated crystallization front is guided uniformly in one or more desired directions. Further, in this manner, the chance occurrence of crystallization seeds is prevented, so that extremely large monocrystalline films form, which can be selectively influenced as to their shape.

The crystallization process in an amorphous or disordered metallic film which is occasioned by the beam irradiation, requires relatively low amounts of energy and proceeds very quickly. This is advantageous in that the total coated substrate surface does not have to be heated in an inconvenient and time-consuming manner. Further, the crystallization process can remain limited to defined regions so that electrical component structures which may already be present on a substrate are not damaged in any way.

The inventive process is useful for manufacturing structured paths or leads or conductor leads or selected metallic regions, as required, for example, for contact electrodes in solar cells, in monocrystalline form. In accordance with such process, a metallic layer is either deposited structured on a substrate at relatively low temperatures in an amorphous or greatly disordered form, or, after being uniformly deposited on an entire substrate surface, is structured as desired via conventional photo-etching techniques and thereafter is converted into a monocrystalline or coarse-grained crystalline form by controlling the velocity of the focused energy beam as it passes in a desired manner over the structured amorphous layer or by controlling the number of passes traversed by such energy beam across the structured layer, for example by a computer-program controlled laser beam. During the conversion process, the substrate is maintained at relatively low deposition temperatures so as to prevent the occurrence of additional crystallization seeds.

A suitable shaping of the structure, for example, a sinuously meandering path, can additionally influence the seed selection, or facilitate it and thus replace the so-called "thin collar or neck method".

DESCRIPTION OF THE PREFERRED EMBODIMENTS

The principles of the invention will be explained further with reference to the drawings wherein two exemplary embodiments of the invention are illustrated.

Figure 1:
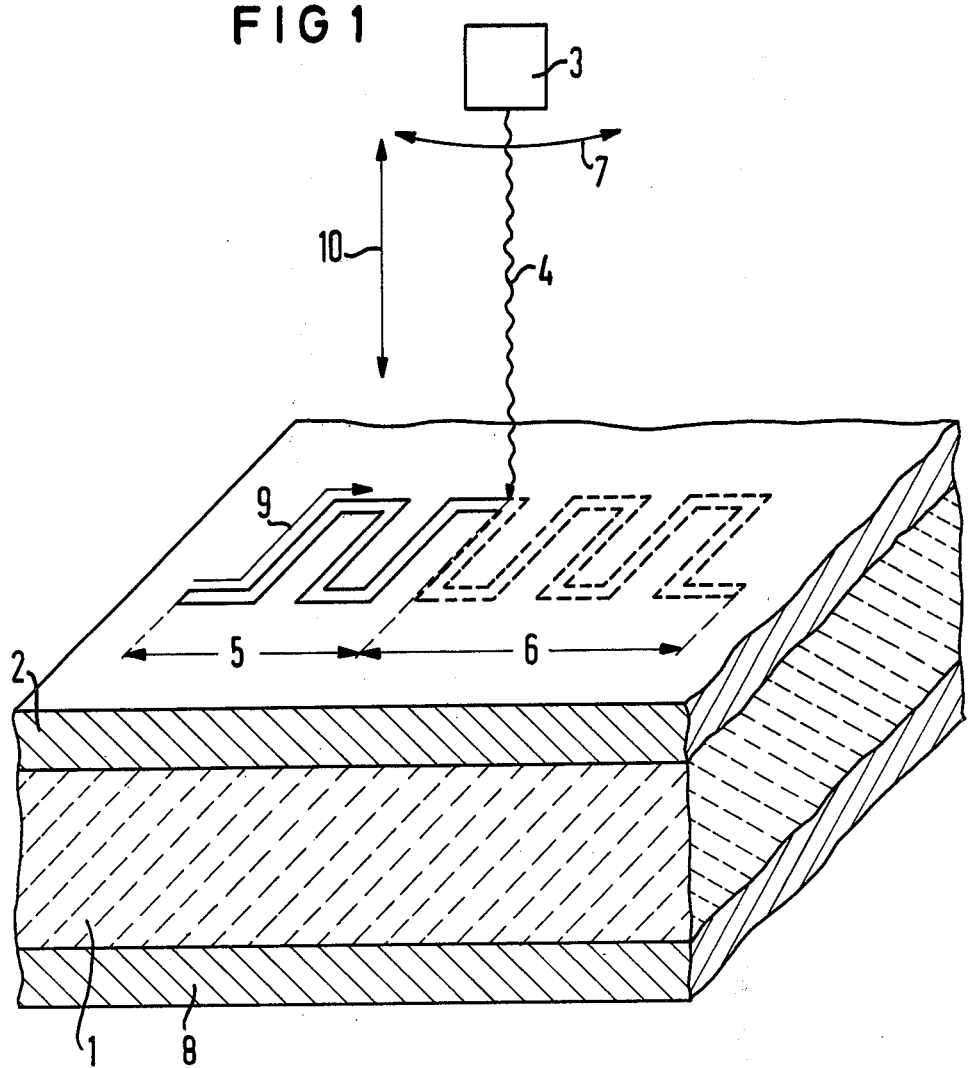
FIG. 1 is a somewhat schematic, elevated, partially cross-sectional view of a metallic layer undergoing an exemplary processing in accordance with the principles of the invention.
Figure 2:
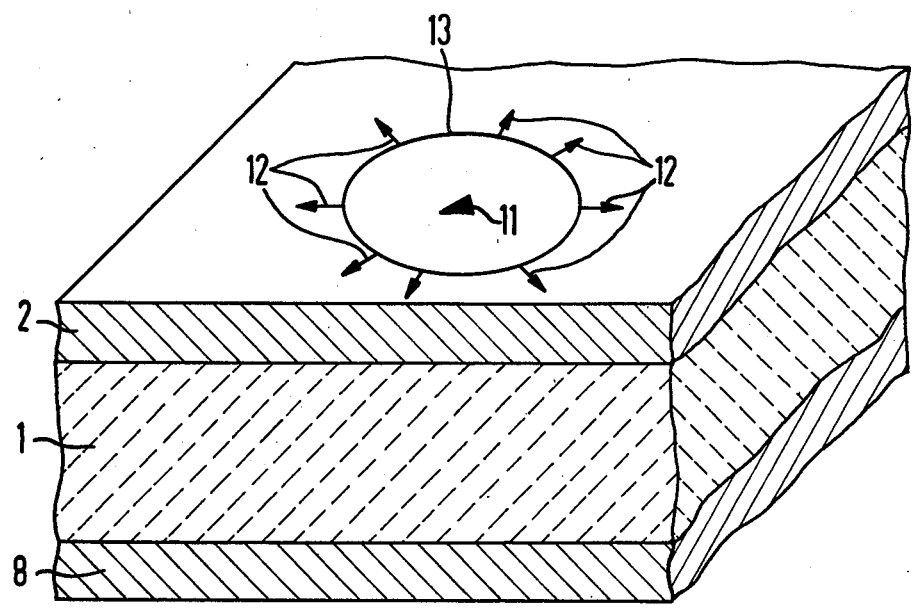
FIG. 2 is a somewhat similar schematic view of a metallic layer undergoing another exemplary processing in accordance with the principles of the invention.

FIG. 1 shows an arrangement for practicing the invention with the use of a controlled laser beam and FIG. 2 shows the formation of a crystallization front with the use of a shutter means, similar in principle to a photograph device.

As shown in FIG. 1, a substrate 1, for example composed of a ceramic, is provided, as by sputtering or vapor-deposition, with a relatively uniform amorphous metallic layer 2, for example composed of tantalum. In a preferred embodiment, the layer 2 is applied onto a substrate surface via sputtering while the substrate surface is maintained at about $-160°$ C. A focused laser beam 4, generated by an operable laser light source 3, is controllably swept-over select surface areas of layer 2 to convert such areas into coarse-grained crystalline or monocrystalline form. The laser source 3 is selectively positionable relative to layer 2 for varying beam intensity, as schematically indicated by the double-headed arrow 10 and is selectively movable relative to layer 2 for impingement on select surface areas thereof or for traversing a select path, as schematically indicated by arrow 9.

In the illustrated embodiment, a selected portion of region 5 of the sputtered-on layer 2 has already been converted into a monocrystalline form while select portions of region 6 (indicated by broken lines) are still to be swept-over by the laser beam. The remaining regions of layer 2, ie., those areas not impinged upon by the beam 4, remain in an amorphous or disordered state. The double-headed arrow 7 schematically indicates that laser beam source 3 is adjustable for varying the beam direction as desired. A cooling system 8 is provided in operable relation with the coated substrate so as to maintain it at a relatively constant temperature (i.e., $-160°$ C.) during beam irradiation.

In FIG. 2, identical structures have been referenced with the same reference numerals as utilized in conjunction with FIG. 1. For the sake of simplicity, a laser beam source with a mechanical shutter means is not illustrated and only the area impinged-upon by such a controlled beam is schematically shown. Upon selective opening of a shutter means, a crystallization seed 11 is spontaneously generated on the coated substrate surface and grows in the direction of arrows 12 so as to form a monocrystalline surface 13, in a manner shown at FIG. 2. In this embodiment, the shutter means can be opened as desired so that any shape monocrystalline or coarse-grained crystalline surface area can be generated as desired.

With the foregoing general discussion in mind, there is presented detailed exemplary embodiments which will illustrate to those skilled in the art the manner in which this invention is carried out. However, the exemplary embodiments are not to be construed as limiting the scope of the invention in any way.

EXAMPLE 1

A layer of amorphous tantalum was deposited on a ceramic substrate maintained at a temperature of about $-160°$ C. in a layer thickness of about 0.5 μm. The crystallization temperature for amorphous tantalum is about $-80°$ C. Thereafter, a ruby laser (0.59 μm wavelength) was brought into operational relation with the tantalum-coated substrate which was maintained at about $-160°$ C. so that the distance from the exit window of the laser to the surface of the amorphous tantalum layer was about 1 meter. The laser was operated in a continuous wave mode and energized to provide an energy density of approximately 1 joule/cm$^2$ onto the tantalum surface. This laser beam was caused to trace a path on the amorphous tantalum surface approximately resembling the path 9, schematically shown at FIG. 1. After irradiation, the traced path was determined to be monocrystalline tantalum while the adjacent untraced regions remained in the amorphous state. The detected depth of the monocrystalline tantalum was approximately 0.5 μm.

EXAMPLE 2

The procedure of Example 1 was substantially repeated, except that the laser was provided with a shutterlike diaphragm positioned between the exit window of the laser and the surface of the amorphous tantalum layer. When the diaphragm was opened, a spontaneous crystallization occurred in a shape corresponding to that of the diaphragm opening. The diaphragm opening velocity was in the order of several milliseconds.

As workers in this art will appreciate, the actual operating parameters in a given system depend upon a number of variables which can routinely be determined and which include, for example, the composition of the amorphous layer, select regions of which are to be converted into a monocrystalline state; such layer thickness; the dimensions of the desired monocrystalline regions, i.e., the width of the monocrystalline paths; the spacing between an energy source and the irradiated layer; the duration of the irradiation; the ambient medium; the degree of thermal stability of the deposited amorphous layer; the type of energy source utilized, i.e., whether a pulsed laser or a continuous laser is utilized; the frequency of the laser beam utilized, etc.

As is apparent from the foregoing specification, the present invention is susceptible of being embodied with various alterations and modifications which may differ particularly from those that have been described in preceeding specification and description. For this reason, it is to be fully understood that all of the foregoing is intended to be merely illustrative and is not to be construed or interpreted as being restrictive or otherwise limiting of the present invention, accepting as it is set forth and defined in the hereto-appended claims.

I claim as my invention:

1. In a method of producing specifically shaped coarse-grained crystalline or monocrystalline surfaces or lines in metal or alloy films on substrates composed of a material selected from the group consisting of ceramic, glass and silicon through the conversion of an amorphous film deposited at a temperature ranging from about room temperature to about −160° C. on a surface of such substrate, the improvement comprising:
controllably guiding a focused energy beam over select areas of said amorphous metallic layer; and
substantially simultaneous maintaining said substrate and said deposited metallic layer at a relatively low temperature approximately equal to said deposition temperature of said metallic layer onto said substrate whereby crystallization seeds are locally and directly formed at the beam-irradiated areas and function as a starting point for a monocrystalline front which is guided into a desired direction to form specifically-shaped crystalline or monocrystalline surfaces or lines in the amorphous metallic films.

2. In a method as defined in claim 1 wherein said focused energy beam is generated by a monochromatic light source.

3. In a method as defined in claim 2 wherein said light source is a laser beam source.

4. In a method as defined in claim 2 wherein said laser beam source is selectively movable relative to said amorphous metallic film for select different spacing between said source and said film and for selective different beaming direction between said source and said film.

5. In a method as defined in claim 3 wherein said laser beam source is operationally connected to a computer means and said computer means guides the generated laser beam onto said amorphous metallic film in accordance with a preselected program.

6. A method of producing metallizations for integrated semiconductor circuits, comprising:
providing a substrate composed of a material selected from the group consisting of ceramic, glass and silicon and having a plurality of separate semiconductor circuit components on a surface thereof arranged to define an integrated semiconductor circuit;
depositing at a temperature ranging from about room temperature to about −160° C. a selectively structured amorphous metallic layer onto said substrate surface at regions thereof requiring metallization;
maintaining the so-coated substrate at a relatively low temperature about equal to said temperature utilized during deposition of said amorphous metallic layer; and
substantially simultaneously guiding a focused energy beam over select areas of said amorphous metallic layer whereby crystallization seeds are locally and directly formed at the beam-irradiated areas and function as a starting point for a monocrystalline front which is guided into the desired direction to form a coarse-grained crystalline or monocrystalline metallic layer in the amorphous metallic layer so as to metallically connect said plurality of separate circuit components into an operational integrated semiconductor circuit.

7. A method of manufacturing contact electrodes for solar cells comprising:
providing operative solar cells having a surface for contact electrodes;
depositing at a temperature ranging from about room temperature to about −160° C. a selectively structured amorphous metallic layer onto said surface of the solar cells at regions thereof requiring contact electrodes;
maintaining the so-coated solar cells at a relatively low temperature about equal to said temperature utilized during deposition of said amorphous metallic layer; and
substantially simultaneously controllably guiding a focused energy beam over select areas of said amorphous metallic layer whereby crystallization seeds are locally and directly formed at the beam-irradiated areas and function as a starting point for a monocrystalline front which is guided into a desired direction to form specifically-shaped crystalline or monocrystalline lines in the amorphous metallic layer defining contact electrodes for said solar cells.

8. A method as defined in claim 7 wherein said solar cells are composed of amorphous silicon.

* * * * *